US006639785B1

(12) United States Patent
Pursche

(10) Patent No.: US 6,639,785 B1
(45) Date of Patent: Oct. 28, 2003

(54) CAPACITOR COMPONENT

(75) Inventor: Udo Pursche, Dresden (DE)

(73) Assignee: Marconi Communications GmbH, Backnang (DE)

( * ) Notice: Subject to any disclaimer, the term of this patent is extended or adjusted under 35 U.S.C. 154(b) by 0 days.

(21) Appl. No.: 10/070,678

(22) PCT Filed: Sep. 8, 2000

(86) PCT No.: PCT/IB00/01370

§ 371 (c)(1),
(2), (4) Date: Jun. 18, 2002

(87) PCT Pub. No.: WO01/20623

PCT Pub. Date: Mar. 22, 2001

(30) Foreign Application Priority Data

Sep. 10, 1999 (DE) .......................... 199 43 251

(51) Int. Cl.[7] ................................. H01G 4/38
(52) U.S. Cl. ...................... 361/328; 361/306; 361/321; 361/386; 361/748
(58) Field of Search ................. 361/238, 306, 361/321, 386, 727, 767, 813, 766, 738, 761, 748

(56) References Cited

U.S. PATENT DOCUMENTS

| | | | |
|---|---|---|---|
| 5,034,850 A | | 7/1991 | Hernandez et al. |
| 5,365,405 A | * | 11/1994 | Hoenlein et al. |
| 5,844,330 A | * | 12/1998 | Furukawa et al. |
| 6,396,292 B2 | * | 5/2002 | Hembree et al. |

FOREIGN PATENT DOCUMENTS

DE 195 17 703 A1 11/1996
JP 408274508 A * 10/1996

OTHER PUBLICATIONS

Patent Abstracts of Japan vol. 1997, No. 02, Feb. 28, 1997 & JP 08 274508 A, Oct. 18, 1996.
Patent Abstracts of Japan vol. 014, No. 178 (E–0915), Apr. 10, 1990 & JP 02 032516 A, Feb. 2, 1990.
Patent Abstracts of Japan vol. 013, No. 370 (P–920), Aug. 17, 1989 & JP 01 126730 A, May 18, 1989.*
Patent Abstracts of Japan vol. 1999, No. 11, Sep. 30, 1999 & JP 11 154621 A, Jun. 8, 1999.*

* cited by examiner

*Primary Examiner*—Dean A. Reichard
*Assistant Examiner*—Nguyen Ha
(74) *Attorney, Agent, or Firm*—Michael J. Striker

(57) ABSTRACT

The capacitor component is mounted on a component assembly carrier provided with electronic circuit elements. The capacitor component includes at least two capacitors (C1, C2) formed on a common dielectric substrate plate (1). To avoid production-caused fluctuations in the capacitances in the production of identical kinds of capacitors with the same capacitances, first and third electrode layers for the capacitors (C1, C2) are applied at the same time to the top side of the dielectric substrate plate, and the second and fourth electrode layers are applied at the same time to the underside of the dielectric substrate plate opposite to the first and third dielectric layers respectively. The spatial dimensions of the third electrode layer correspond to the dimensions of the first electrode layer, and the spatial dimensions of the fourth electrode layer correspond to the dimensions of the second electrode layer, so that the respective capacitances of the capacitors (C1, C2) are matched as precisely as possible.

13 Claims, 1 Drawing Sheet

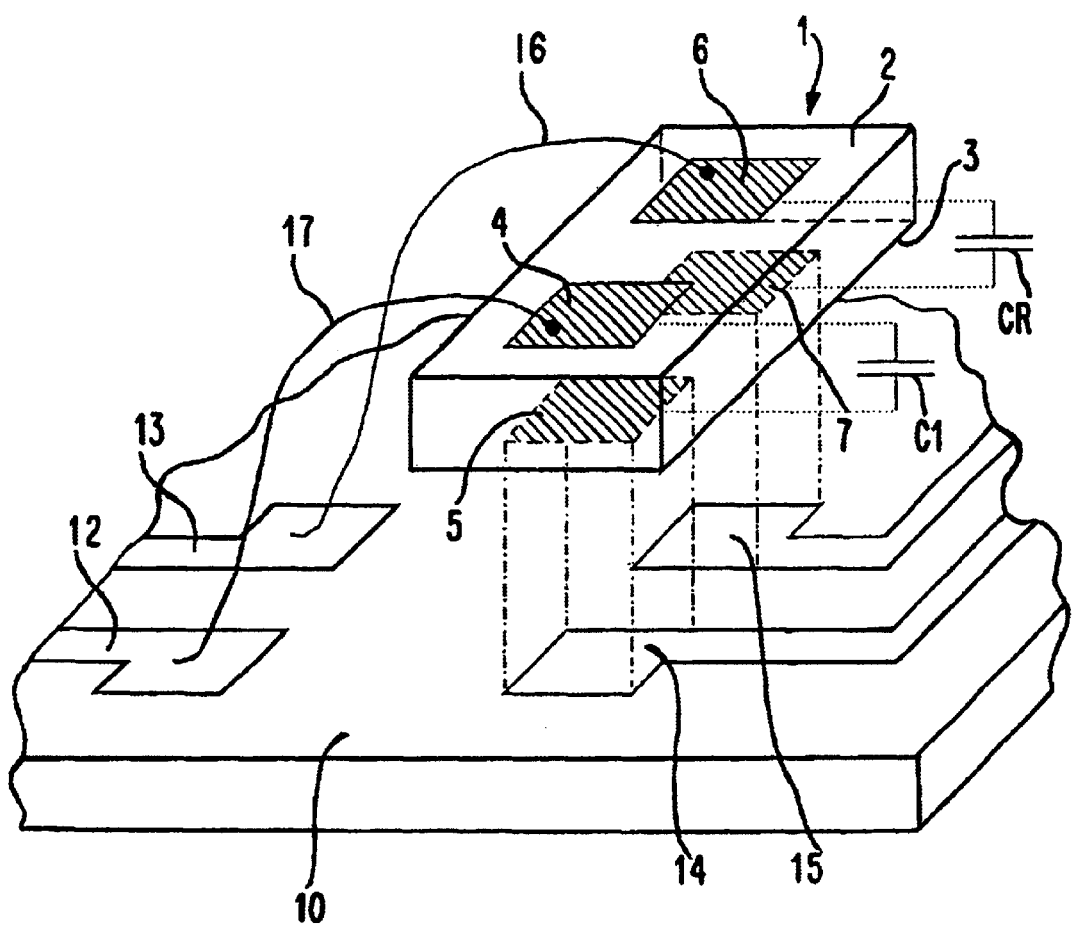

CAPACITOR COMPONENT

BACKGROUND OF THE INVENTION

1. Field of the Invention

The invention relates to a capacitor component for mounting on a component assembly carrier provided with electronic circuit elements, to the component assembly carrier and to a method of making the capacitor component, in order to provide a plurality of capacitors with precisely matched capacitances.

2. Description of the Related Art

One such capacitor component is known for instance from U.S. Pat. No. 5,034,850 and includes a ceramic plate onto which a first electrode layer is applied. Applied to the first electrode layer is a thin dielectric layer, followed by a second electrode layer. The terminals of the electrode layer are extended laterally out of the component and are carried to the underside of the ceramic plate by means of conductors applied to the face ends of the capacitor component. Such capacitor components are mounted as discrete capacitive components, for instance onto printed circuit boards, and are soldered to the conductor tracks present there. Not only is the complicated design of the terminals, which makes producing such capacitor components relatively expensive, a disadvantage, but moreover the capacitances of two identically designed capacitor components, each of which includes a single capacitor, can deviate sharply from one another.

The reasons for this can be found in the tolerances in the production of the components. The applied electrode layers can fluctuate from one time to another in their thickness and surface area. Furthermore, fluctuations in thickness of the dielectric layer employed and a variable offset of the upper and lower capacitor electrodes in production lead to different capacitances of the components produced. For these reasons, the known capacitor components cannot be used in all electronic circuits. Especially for electronic bridge circuits, in which capacitors whose capacitances match as precisely as possible must be used, the known capacitor components are unsuitable.

SUMMARY OF THE INVENTION

It is an object of the present invention to provide a capacitor component with at least two capacitors having precisely matched capacitances and a component assembly carrier with the capacitor component mounted on it and with electronic elements connected electrically with the at least two capacitors.

It is another object of the present invention to provide a method of making the capacitor component with at least two capacitors having precisely matched or identical capacitances.

According to the invention the capacitor component comprises at least two capacitors including a first and second capacitor and a common dielectric substrate plate. The first capacitor has a first electrode layer on a top side of the dielectric substrate plate and a second electrode layer on an underside of the dielectric substrate plate opposite from the first electrode layer. The second capacitor correspondingly has a third electrode layer on the top side of the dielectric substrate plate and a fourth electrode layer arranged on the underside of the dielectric substrate plate opposite from the third electrode layer. The third electrode layer has spatial dimensions corresponding to those of the first electrode layer, and the fourth electrode layer has spatial dimensions corresponding to those of the second electrode layer, whereby the capacitors have precisely matched capacitances.

In the method of making the capacitor component, the first and third electrode layers are applied at the same time to top side of the dielectric substrate plate and the second and fourth electrode layers are applied at the same time to the underside of the dielectric substrate plate.

With the capacitor component according to the present invention, the disadvantages known from the prior art are avoided. The capacitor component of the invention has at least two identically constructed capacitors, whose dielectric layer is formed by the same dielectric substrate plate. Since the electrodes on the top and bottom sides of the dielectric substrate plate are made on the same substrate in the same production process, an offset between the upper and lower electrode layers, or a deviation in the thickness of the electrode layers resulting from fluctuations in quantity upon the application of material, always affect the. magnitude of the capacitances of the two capacitors to the same extent. The relative deviations in capacitance thus always remain very small. Another advantage is the simplified structure of the capacitor component, comprising a dielectric layer provided with electrode layers on the top and bottom sides, which dielectric layer at the same time serves as a carrier plate. This makes it unnecessary to provide a separate carrier for mechanically stabilizing the capacitor structures, as is needed in U.S. Pat. No. 5,034,850.

Refinements of the invention and advantageous embodiments are made possible by the characteristics recited in the dependent claims.

Advantageously, a ceramic plate is provided as the dielectric substrate plate. Such plates can easily and inexpensively be produced with high precision.

Advantageously, the electrode layers are applied to the dielectric substrate plate by thick-film or thin-film technology.

Preferably, the procedure is such that the first and third electrode layers are applied in a common method step to the top side of the carrier plate, and the second and fourth electrode layers are applied to the underside, also in a common method step, under the same process conditions, to the dielectric substrate plate. As a result, electrode layers with geometric dimensions that deviate only extremely slightly from one another can advantageously be created on one side of the carrier plate. Thus the capacitors formed in the capacitor component all have the same capacitance.

Advantageously, the capacitor component can be mounted as a discrete component onto a component assembly carrier and contacted electrically and mechanically to conductor tracks located there, for instance by reflow soldering. The electrode layers present on the top side of the capacitor component are contacted to further conductor tracks of the component assembly carrier via bond wires. Thus the capacitor component can be mounted relatively simply and inexpensively, by well-mastered techniques.

BRIEF DESCRIPTION OF THE SOLE DRAWING FIGURE

One exemplary embodiment of the invention is shown in the drawings and will be explained in the ensuing description. The sole drawing FIGURE schematically shows a component assembly carrier with the capacitor component according to the invention.

DESCRIPTION OF THE EXEMPLARY EMBODIMENT

As shown in the sole drawing FIGURE, the capacitor component of the invention includes a substantially blockshaped dielectric substrate plate 1, for instance a ceramic plate with a high dielectric constant. A first electrode layer 4 and a third electrode layer 6 are applied to the top side 2 of the dielectric substrate plate 1. A second electrode layer 5 and a fourth electrode layer 6 are also applied to the underside 3 of the dielectric substrate plate 1. The electrode layers 4–7 all have the same geometric dimensions and accordingly the same surface area and layer thickness, and are preferably embodied rectangularly. By means of the first electrode layer 4 on the top side 2 of the carrier plate and the second electrode layer 5, opposite it on the underside 3 of the carrier plate 1, a first capacitor C1 is formed, as represented in the drawing by the corresponding symbol for a capacitor. The third electrode layer 6, with the fourth electrode layer 7 opposite it on the underside 3, forms a second capacitor C2. Except for extremely slight deviations, which are hardly detectable within the scope of measurement precision, both capacitors C1, C2 of the capacitor component have the same capacitance.

The electrode layers can be applied to the dielectric carrier substrate 1 by thick-film or thin-film technology. For instance, thin-film technologies such as photolithographic processes, vapor deposition or sputtering to deposit metallizing on the carrier plate to form the electrode layers are possible. Another possible way of creating the electrode layers is by thick-film technologies, such as screen printing.

Regardless of the production technique employed, the procedure is such that the electrode layers on the top side and the electrode layers on the underside are each produced in a common method step, under the same process conditions and ambient influences. For instance, the electrode layers 4, 6 are created in the same photolithography process, and the same vapor deposition step, or the same screen printing step. The same is true for the electrode layers 5, 7 on the underside. In this way, it can be assured that fluctuations and tolerances in deposition of material, in etching, vapor deposition or screen printing, always occur identically in all the electrode layers that have been created on the same side of the carrier substrate. Errors of coincidence between the electrode layers 4, 6 on the top side 2 and electrode layers 5, 7 on the underside also always occur in the same way for both capacitors C1, C2. A major deviation in capacitances of the two capacitors formed can thus be prevented.

Naturally, the same is correspondingly true for a capacitor component that in addition to the two capacitors shown in this exemplary embodiment has still other capacitors with further electrode layers that are all created in the same way on the same dielectric carrier substrate.

Preferably, the capacitor component is applied in the direction of the arrow in the drawing to the mounting side 11 of a component assembly carrier 10, for instance a printed circuit board. Other electric and electronic circuit elements, not shown, are located on the mounting side 11. Conductor tracks 12–13 serve to connect the capacitor component to the electronic circuit elements. The ends, provided for purposes of contacting, of the conductor tracks 14–15 are for instance printed using solder paste. The capacitor component is then placed onto the component assembly carrier 10 in the direction of the arrow shown in the drawing, so that the second and fourth electrode layers 5 and 7 rest on the ends of the conductor tracks 14 and 15. This can preferably also be done by SMD (Surface Mounted Device) technology. Next, the electrode layers 5, 7 are soldered to the conductor tracks 14, 15 in a reflow solder station. Finally, after the reflow soldering process, the first and third electrode layers 4, 6 are then each electrically connected via a respective bond wire 16, 17 to two further conductor tracks 12, 13 of the component assembly carrier 10.

As a result of the mounting of the capacitor component on the component assembly carrier 10, two or more than two capacitors with the same capacitances are furnished on the component assembly carrier in a very simple way and these can be connected, for instance via the conductor tracks 12–15 of the component assembly carrier, to a microwave bridge circuit. Relative variations among the partial capacitors C1, C2 are thus largely avoided.

What is claimed is:

1. A capacitor component for mounting on a component assembly carrier (10), said component assembly carrier (10) having a plurality of electronic circuit elements (12–15) mounted thereon;

wherein said capacitor component consists of at least two capacitors (C1, C2) and a common dielectric substrate plate (1), said at least two capacitors including a first capacitor (C1) and a second capacitor (C2);

wherein said first capacitor (C1) comprises a first electrode layer (4) arranged on a top side (2) of said dielectric substrate plate (1) and a second electrode layer (5) arranged on an underside (3) of said dielectric substrate plate (1) opposite from said first electrode layer (4); and wherein said second capacitor (C2) comprises a third electrode layer (6) arranged on the top side (2) of the dielectric substrate plate (1) and a fourth electrode layer (7) arranged on the underside (3) of said dielectric substrate plate (1) opposite from said third electrode layer (6); and wherein the third electrode layer (6) and the first electrode layer (4) have spatial dimensions that are the same, and the fourth electrode layer (7) and the second electrode layer (5) have spatial dimensions that are the same;

whereby said first capacitor and said second capacitor have respective capacitances that are the same.

2. The capacitor component as defined in claim 1, wherein said dielectric substrate plate (1) is a ceramic plate.

3. The capacitor component as defined in claim 1, wherein said electrode layers (4, 5, 6, 7) are applied to said dielectric substrate plate (1) by a thick-film technology method or a thin-film technology method.

4. The capacitor component as defined in claim 3, wherein said first and third electrode layers (4, 6) are applied to the dielectric substrate plate (1) at the same time by a common method step, and the second and fourth electrode layers (5, 7) are likewise applied at the same time by another common method step.

5. A component assembly carrier provided with a capacitor component mounted thereon and a plurality of electronic circuit elements (12–15) mounted thereon, said electronic circuit elements (12–15) including respective conductor tracks (14,15) and respective further conductor tracks (12, 13);

wherein said capacitor component consists of at least two capacitors (C1, C2) and a common dielectric substrate plate (1), said dielectric substrate plate (1) having a top side (2) and an underside (3); said at least two capacitors include a first capacitor (C1) and a second capacitor (C2) and said dielectric carrier substrate (1) is placed with said underside (3) on the component assembly carrier;

wherein said first capacitor (C1) comprises a first electrode layer (4) arranged on the top side (2) of said dielectric substrate plate (1) and a second electrode layer (5) arranged on the underside (3) of said dielectric substrate plate (1) opposite from said first electrode layer (4); and said second capacitor (C2) comprises a third electrode layer (6) arranged on the top side (2) of the dielectric substrate plate (1) and a fourth electrode layer (7) arranged on the underside (3) of said dielectric substrate plate (1) opposite from said third electrode layer (6); and wherein the third electrode layer (6) has spatial dimensions that are the same as those of the first electrode layer (4), the fourth electrode layer (7) has spatial dimensions that are the same as those of the second electrode layer (5) and the second and fourth electrode layers (5, 7) arranged on the underside (3) of the carrier substrate (1) are applied to said respective conductor tracks (14, 15);

whereby said first capacitor and said second capacitor have capacitances that are the same.

6. The component assembly carrier as defined in claim 5, wherein the second electrode layer (5) and the fourth electrode layer (7) of the carrier substrate (1) are soldered to said respective conductor tracks (14, 15) of the component assembly carrier (10), and the first electrode layer (4) and the third electrode layer (6) are electrically connected to said respective further conductor tracks (12, 13) of the component assembly carrier (1) via corresponding bond wires (16, 17).

7. A method of making a capacitor component for a component assembly carrier equipped with electrical circuit elements, said capacitor component consisting of at least two capacitors (C1, C2) and a common dielectric substrate plate (1), said at least two capacitors including a first capacitor (C1) and a second capacitor (C2); wherein said first capacitor (C1) comprises a first electrode layer (4) arranged on a top side (2) of said dielectric substrate plate (1) and a second electrode layer (5) arranged on an underside (3) of said dielectric substrate plate (1) opposite from said first electrode layer (4); and said second capacitor (C2) comprises a third electrode layer (6) arranged on the top side (2) of the dielectric substrate plate (1) and a fourth electrode layer (7) arranged on the underside (3) of said dielectric substrate plate (1) opposite from said third electrode layer (6); and wherein the third electrode layer (6) has spatial dimensions that are the same as those of the first electrode layer (4), and the fourth electrode layer (7) has spatial dimensions that are the same as those of the second electrode layer (5); said method comprising the steps of:

a) simultaneously forming said first electrode layer (4) and said third electrode layer (6) on said top side (2) of said dielectric substrate plate (1) in a common method step by a first production technique that is the same for both said first electrode layer (4) and said third electrode layer (6) under process conditions that are the same for both said first electrode layer (4) and said third electrode layer (6) and with spatial dimensions of both said first electrode layer (4) and said third electrode layer (6) the same; and b) simultaneously forming said second electrode layer (5) and said fourth electrode layer (7) on said underside (3) of said dielectric substrate plate (1) in another common method step by a second production technique that is the same for both said second electrode layer (5) and said fourth electrode layer (7) under process conditions that are the same for both said second electrode layer (5) and said fourth electrode layer (7) and with spatial dimensions of both said second electrode layer (5) and said fourth electrode layer (7) the same and so that said second electrode layer (5) is opposite from said first electrode layer (4) and said third electrode layer (6) is opposite from said fourth electrode layer (7);

whereby fluctuations and tolerances of said first electrode layer and said third electrode layer made by said first production technique are the same and fluctuations and tolerances of said second electrode layer and said fourth electrode layer made by said second production technique are the same, so that said first capacitor and said second capacitor have capacitances that are the same.

8. The method as defined in claim 1, wherein each of said first production technique and said second production technique is a thick-film technology process or a thin-film technology process.

9. The method as defined in claim 7, further comprising mounting said common dielectric substrate plate (1) with said underside (3) on said component assembly carrier and applying said second electrode layer (5) and said fourth electrode layer (7) on said underside (3) of said common dielectric substrate plate (1) to respective conductor tracks (14,15) on said component assembly carrier.

10. The method as defined in claim 9, further comprising soldering said second electrode layer (5) and said fourth electrode layer (7) on said common dielectric substrate plate (1) to said respective conductor tracks (14,15) on said component assembly carrier and electrically connecting said first electrode layer (4) and said third electrode layer (6) with respective further conductor tracks (12, 13) on said component assembly carrier via corresponding bonding wires (16,17).

11. The method as defined in claim 7, wherein said first production technique is the same as said second production technique.

12. The method as defined in claim 8, wherein said thick-film technology process is screen printing.

13. The method as defined in claim 8, wherein said thin-film technology process comprises a photolithographic process, a vapor deposition process or a sputtering process.

* * * * *